(12) United States Patent
Park

(10) Patent No.: US 6,194,919 B1
(45) Date of Patent: Feb. 27, 2001

(54) MAIN AMPLIFIER

(75) Inventor: San Ha Park, Seoul (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/210,389

(22) Filed: Dec. 14, 1998

(30) Foreign Application Priority Data

Dec. 30, 1997 (KR) .................................................. 97-79126

(51) Int. Cl.[7] .......................................................... H03F 3/45
(52) U.S. Cl. .............................................. 327/52; 327/53
(58) Field of Search ................................. 327/52, 53, 63, 327/65

(56) References Cited

U.S. PATENT DOCUMENTS

| | | | |
|---|---|---|---|
| 5,477,170 | * 12/1995 | Yotsuyanagi | 327/66 |
| 5,528,543 | * 6/1996 | Stiegler | 368/207 |
| 5,834,974 | * 11/1998 | Kim | 330/253 |
| 5,886,546 | * 3/1999 | Hwang | 327/103 |
| 6,009,032 | * 12/1999 | Lin et al. | 365/208 |

OTHER PUBLICATIONS

Sakata, Takeshi et al., "An Experimental 220–MHZ 1–Gb DRAM with a Distributed–Column–Control Architecture", Nov. 11, 1995, IEEE Journal of Solid–State Circuits, vol. 30, pp. 1165–1170.

* cited by examiner

Primary Examiner—Toan Tran
Assistant Examiner—Linh M Nguyen
(74) Attorney, Agent, or Firm—Fleshner & Kim, LLP

(57) ABSTRACT

An amplifier is provided that includes a current amplifying and current/voltage converting part that performs current amplification with respect to signals received from a first data bus and a second data bus. The current amplifying and current/voltage converting part further converts the amplified signal currents into a voltage. The amplifier further includes a voltage amplifying part that amplifies the voltage from the current amplifying part and current/voltage converting part to produce an amplified output.

13 Claims, 5 Drawing Sheets

MAIN AMPLIFIER

BACKGROUND OF THE INVENTION

1. Field of the Invention

The present invention relates to a semiconductor device, and in particular, to a sense amplifier.

2. Background of Related Art

A main amplifier generally uses a voltage sensing method or a current sensing one. The voltage sensing method will now be described.

A signal, amplified by a sense amplifier, is transmitted from a bit line to a data sense amplifier by column selection. Since the sense amplifier is connected in common in a single cell array block, a long wiring length is needed, which makes it difficult to transmit signals at high speed. There is a need to develop a high-sensitivity data sense amplifier that reduces the parasitic capacitance and resistance through such wiring.

FIG. 1 is a circuit diagram of a related art main amplifier using a voltage sensing method. As shown in FIG. 1, a main amplifier using the voltage sensing method includes a first-stage amplifying part 11, a first enabling part 13 that drives the first-stage amplifying part 11, a second-stage amplifying part 15 and a second enabling part 17 that drives second-stage amplifying part 15.

The first-stage amplifying part 11 has first and second differential amplifiers 11a and 11b, and the second amplifying part 15 has third and fourth differential amplifiers 15a and 15b. The first and second enabling parts 13 and 17 each are a metal oxide semiconductor (MOS) transistor. In the related art main amplifier using the voltage sensing method, the first-stage amplifying part 11 is driven by the first enabling part 13 to amplify an applied signal. The amplified signal is transmitted to second-stage amplifying part 15 to be amplified a second time. The differential amplifier is also called a data bus sense amplifier, and consists of a current mirror with four transistors.

Transistors Q1, Q2, Q3 and Q4 constitute the first differential amplifier 11a, and transistors Q5, Q6, Q7 and Q8 form the second differential amplifier 11b. Transistors Q9, Q10, Q11, and Q12 and transistors Q13, Q14, Q15, and Q16 respectively constitute the third differential amplifier 15a and the fourth differential amplifier 15b. One of a data bus DB and a data bus $\overline{DB}$, which are precharged "high" during a data read, transitions "low" from output data of a bit-line sense amplifier (not shown), and the other one maintains a "high" level. A low-level signal is applied to an input terminal of the transistor Q1, and a high-level signal is input to an input terminal of the transistor Q2. A low-level signal is applied to an input terminal of the transistor Q5, and a high-level signal is input to the transistor Q6. If a driving signal is input to first enabling part 13, the MOS transistor is turned on. The signal, amplified once by the first differential amplifier 11a, is transmitted to the third and fourth differential amplifiers 15a and 15b of the second-stage amplifying part 15. Similarly, the signal, amplified once by the second differential amplifier 11b, is sent to the third and fourth differential amplifiers 15a and 15b of the second-stage amplifying part 15.

As shown in FIG. 1, the signal, amplified by the first differential amplifier 11a, is simultaneously applied to a gate of the transistor Q9 of the second-stage amplifying part 15 and a gate of the transistor Q13. The signal, amplified by the second differential amplifier 11b, is concurrently applied to a gate of the transistors Q10 and Q14 of the second-stage amplifying part 15. The third and fourth differential amplifiers 15a and 15b amplify the first amplified signal and produce the same through an output buffer (not shown).

FIG. 2 is a circuit diagram of a related art main amplifier using the current sensing method. The related art main amplifier using the current sensing method includes a current/voltage converter 21 and a differential amplifying part 23 amplifying a signal converted into a voltage.

The current/voltage converter 21 converts a current into a voltage and is constituted by a current mirror having four transistors M1, M2, M3 and M4. A signal, output from a bit-line amplifier (not shown), is input to a source of the transistor M2 and a drain of the transistor M4. Biases 1, 2 and 3 are applied to the transistors M1, M2 and M3 so that each transistor is actuated in the saturation region.

In the related art current amplifier using the current sensing method, the applied current signal is applied not to the gate of one of the transistors M1, M2 and M3 but to the transistor M4 actuated in the linear region. Therefore, the voltage equivalent to the current is produced from a gate of the transistor M4. The voltage, output from the gate of the transistor M4, is transmitted to differential amplifying part 23 and then amplified, before being output through the output buffer (not shown).

FIG. 3 graphically shows the result of simulation of the related art main amplifier of the voltage sensing method. As shown in FIG. 3, as an input signal and an enabling signal are applied to the main amplifier, the main amplifier is enabled to amplify the signal. It takes about 2.7 nanoseconds (ns) until the main amplifier produces an output signal.

As described above, the related art main amplifiers have various problems. In the main amplifier using the voltage sensing method, the signal produced from the bit-line amplifier (the input signal of the main amplifier) is applied to each gate of the transistors of the differential amplifying parts, which causes a transmission delay. The transmission delay is a severe problem for a highly-integrated semiconductor device because of the large parasitic capacitance. The amplification speed of the related art main amplifier of voltage sensing method is lower than that of current sensing method. In the related art current main amplifier, since biases 1, 2 and 3 are applied so that each transistor is actuated in the saturation region, the main amplifier of the current sensing method varies with a power supply voltage level. When the power supply voltage is low and a transmission line is long, significant time can be required to convert the current into a voltage. Such delay can be a problem for a highly-integrated semiconductor device.

SUMMARY OF THE INVENTION

An object of the present invention is to provide a main amplifier that substantially obviates one or more of the problems caused by limitations and disadvantages of the related art.

Another object of the present invention is to provide a sense amplifier that overcomes variation in an applied signal caused by a low power supply voltage.

Another object of the present invention is to provide a current sense amplifier that prevents a signal transmission delay.

Another object of the present invention is to provide a main current sense amplifier that overcomes a decrease of an applied signal, which results from a low power supply voltage through current amplification, and prevents a signal transmission delay to ensure high-speed data generation in a highly-integrated semiconductor device by the corresponding parasitic capacitance.

To achieve at least these objects and other advantages in a whole or in parts and in accordance with the purpose of the present invention, as embodied and broadly described, the present invention provides a main amplifier including a current amplifying part and a current/voltage converting part each performing current amplification with respect to a signal applied from a first data bus and a second data bus, and converting the amplified signal current into a voltage and a voltage amplifying part amplifying the voltage from the current amplifying part and current/voltage converting part to produce an amplified output.

To further achieve the above objects in a whole or in parts and according to another aspect of the present invention, a main amplifier is provided that includes a first current amplifier circuit that amplifies a first data bus signal, a second current amplifier circuit that amplifies a second data bus signal, a converting circuit that converts the amplified first and second data bus signals into a voltage and a voltage amplifying circuit that amplifies the voltage output from the converting circuit.

To further achieve the above objects in a whole or in parts and according to another aspect of the present invention, a method of operating a current sense amplifier is provided that includes amplifying a first signal current applied through a first data bus, amplifying a second signal current applied through a second data bus, converting each of the amplified first and second signal currents into a voltage and amplifying the voltage to generate an amplified output signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 4:
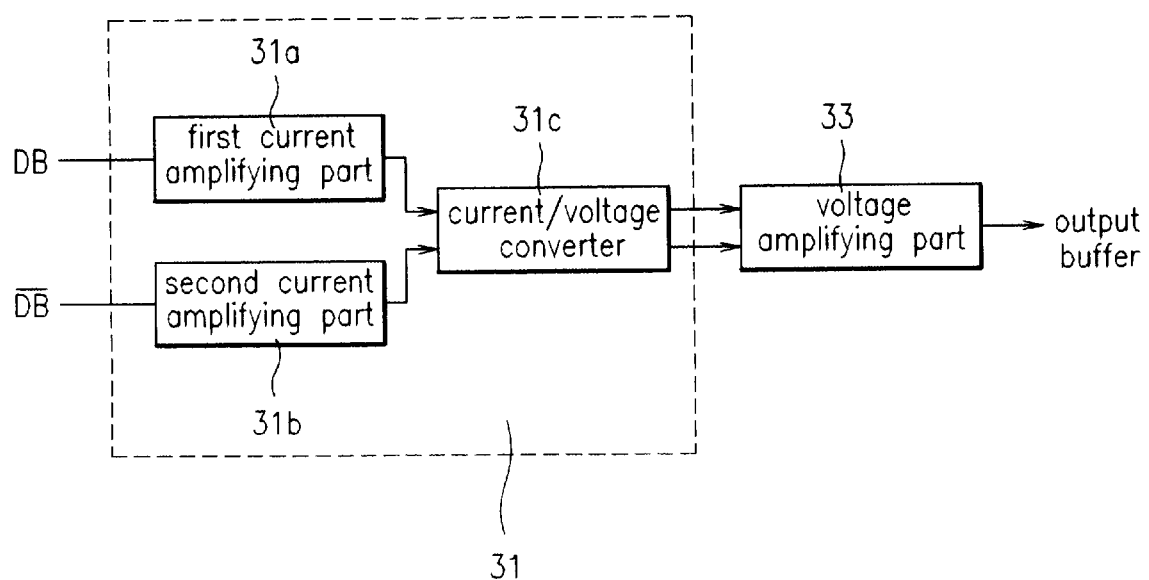
FIG. 4 is a block diagram showing a preferred embodiment of an amplifier in accordance with the present invention.

FIG. 4 is a block diagram showing an amplifier according to a preferred embodiment of the present invention. The preferred embodiment of a main current sense amplifier includes a current amplifying and current/voltage converting part 31 that amplifies an applied signal current and converts an amplified output into a voltage and a voltage amplifying part 33. The voltage amplifying part 33 amplifies the voltage output from current amplifying and current/voltage converting part 31. The current amplifying and current/voltage converting part 31 preferably includes first and second amplifiers 31a and 31b amplifying an applied signal current, and a current/voltage converter 31c converting the amplified signal current into a voltage. The first and second current amplifiers 31a and 31b are preferably differential amplifiers of a current mirror.

The preferred embodiment of the main amplifier of the present invention amplifies an output signal applied from the current amplifying and current/voltage converting part 31, which was converted to a voltage. The voltage is amplified again in the voltage amplifying part 33 and output to an output buffer (not shown).

Figure 5:
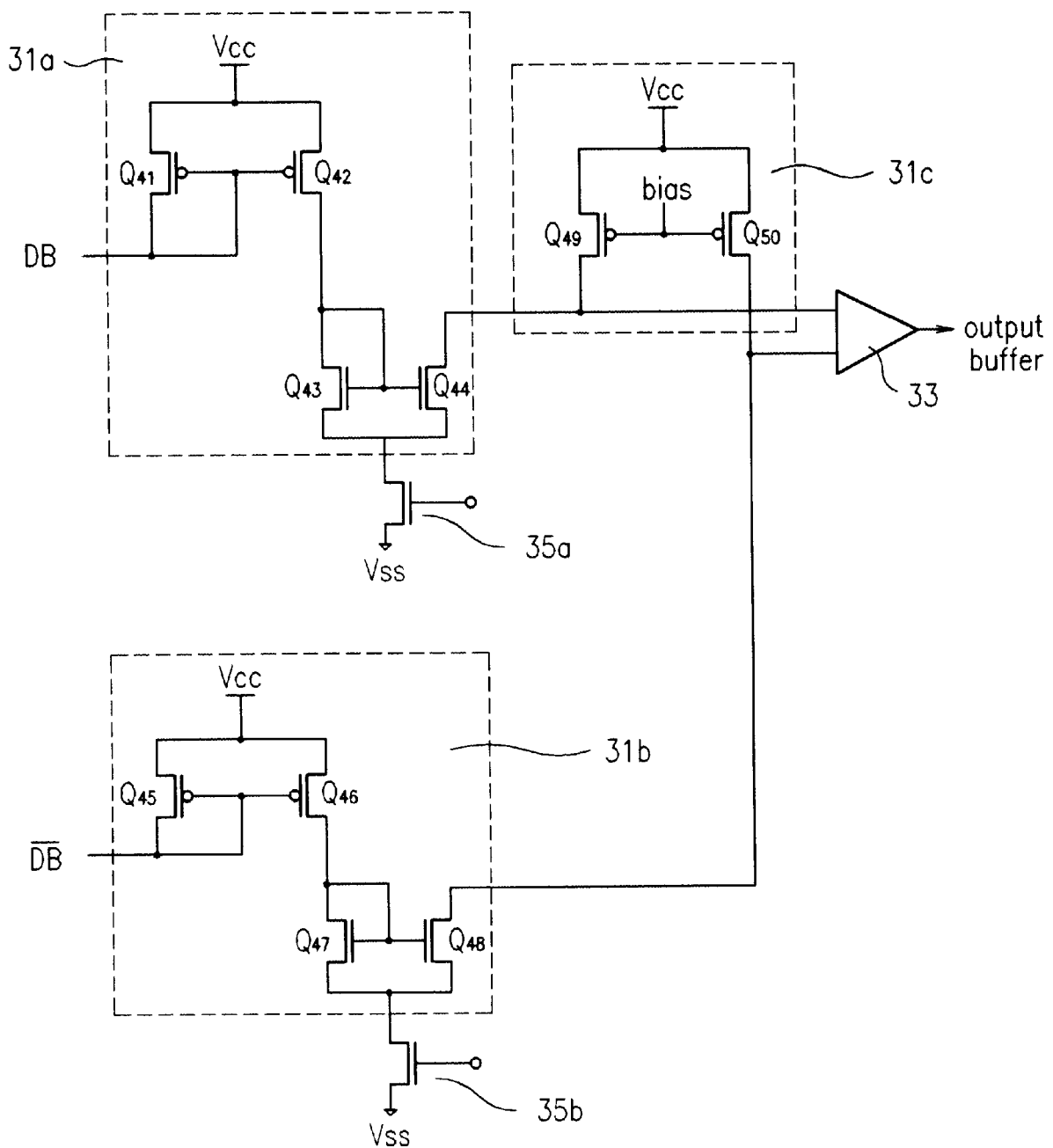
FIG. 5 is a circuit diagram showing an exemplary circuit for the main amplifier of FIG. 4.

FIG. 5 is a diagram showing a detailed view of the preferred embodiment of the main amplifier. The preferred embodiment of the main amplifier includes the first current amplifier 31a amplifying a signal current applied from a first data bus DB, the second current amplifier 31b amplifying a signal current applied from a second data bus $\overline{DB}$ and the current/voltage converter 31c converting an amplified signal current, which is received from the first and second current amplifiers 31a and 31b, into a voltage. Signals in the data busses DB, $\overline{DB}$ can be received from a bit line sense amplifier (not shown). The voltage amplifying part 33 amplifies the converted voltage, and first and second enabling parts 35a and 35b enable the first and second current amplifiers 31a and 31b. The first and second enabling parts 35a and 35b are each preferably an MOS transistor.

The first and second current amplifiers 31a and 31b are each formed by two differential amplifiers of a current mirror, and each differential amplifier includes two transistors. As shown in FIG. 5, drains of two transistors Q41 and Q42 are coupled together and coupled to power supply voltage Vcc. A source of the transistor Q41 is coupled to the data bus DB to receive an input signal. Gates of the transistors Q41 and Q42 are coupled to each other. The transistors Q41 and Q42 are each preferably PMOS transistors. The source of the transistor Q42 is coupled to a drain and a gate of a transistor Q43. The gate of the transistor Q43 is further coupled to a gate of the transistor Q44, and a source of the transistor Q43 is coupled to a drain of the transistor Q44 and to first enabling part 35a. The transistors Q43 and Q44 are each preferably NMOS transistors. Transistors Q45, Q46, Q47 and Q48 form the second current amplifier 3b. The second current amplifier 31b is similar to first current amplifier 31a in construction, however, a signal is input to second current amplifier 31b using the second data bus $\overline{DB}$. Accordingly, a detailed description of the second current amplifier 31b is omitted.

The current/voltage converter 31c will now be described. As shown in FIG. 5, the current/voltage converter 31c includes transistors Q49 and Q50. Gates of the transistors Q49 and Q50 are coupled to each other, and a bias is applied to the gates so that the transistors Q49 and Q50 are actuated in the saturation region.

The bias is applied to transistors Q49 and Q50 because according to transistor characteristics, a current $I_{DS}$, flowing from a transistor drain to a transistor source, abruptly varies with a voltage $V_{DS}$ between the transistor source and drain in the linear region. On the contrary, the variation in the current is very small in the saturation region. When the current $I_{DS}$ varies constantly as the transistor operates in the saturation region, high-level voltage $V_{DS}$ is required. The operation of the transistor in the linear region requires low-level voltage $V_{DS}$.

Accordingly, when current is converted into voltage, it is advantageous to operate the transistor in the saturation region. A drain of the transistor Q49 of current/voltage converter 31c receives a signal current transmitted through the transistor Q44 of the first current amplifier 31a. The signal current is amplified once by transistors Q41 and Q42. The transistor Q50 receives the signal current amplified by the second current amplifier 31b. The current/voltage converter 31c converts the signal current, amplified by first and second current amplifiers 31a and 31b, into a voltage and outputs the converted voltage to the voltage amplifying part 33. Thus, the transistors Q49 and Q50 preferably form the current/voltage converter 31c.

Operations of the preferred embodiment of the main amplifier will now be described. The main amplifier of the preferred embodiment amplifies the signal current applied to improve a decrease in an input signal caused by a low power supply voltage and high integration. The preferred embodiment of the main amplifier further converts the amplified current into a voltage using the current/voltage converter 31c to which a bias is applied to operate the transistors of current/voltage converter 31c in the saturation region. The voltage amplifying part 33 amplifies the amplified signal converted into the voltage, and then outputs the variously amplified output through the output buffer (not shown).

As shown in FIG. 5, the first current amplifier 31a receives a signal applied through the first data bus DB. The transistors Q41 and Q42 amplify the input signal current in the ratio of the size of each of them. The signal current, amplified once by the transistors Q41 and Q42, is then amplified by the transistors Q43 and Q44 in the same manner. The second current amplifier 31b also amplifies the applied signal in the same manner. The second current amplifier 31b amplifies the applied signal current input through second data bus $\overline{DB}$.

The signal current, amplified once by the first and second current amplifiers 31a and 31b, is applied to the current/voltage converter 31c to be converted into a voltage. The signal current, amplified once by first current amplifier 31a, is transmitted to the drain of the transistor Q49 of current/voltage converter 31c. The signal current, amplified once by the second current amplifier 31b, is transmitted to the transistor Q50 of the current/voltage converter 31c. The bias is applied to the gates of the transistors Q49 and Q50 in order that these transistors are actuated and operated in the saturation region.

Operating the transistor Q49 in the saturation region means that the transistor Q49 is just either turned on or turned off without amplification. That is, transistor Q49 is turned on by the applied bias. To pass the increased current, the voltage between the drain and source is converted so the voltage of the drain of the transistor Q49 is applied to the voltage amplifying part 33. When the applied signal sources a large electric current, a low voltage is applied to voltage amplifying part 33. On the contrary, when the applied signal sources a small electric current, a high voltage is applied to voltage amplifying part 33.

Figure 1:
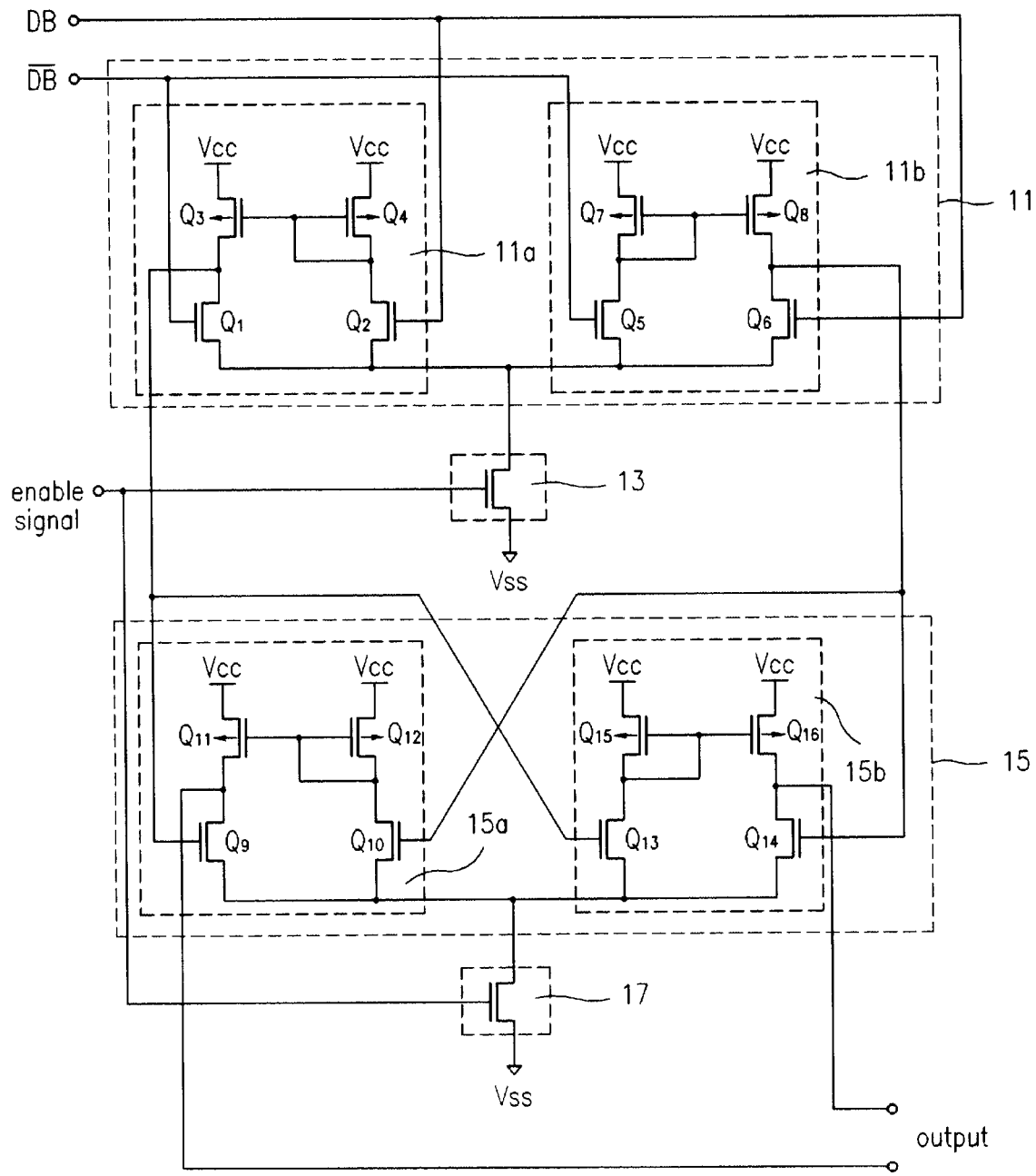
FIG. 1 is a circuit diagram showing a related art main amplifier using a voltage sensing method.
Figure 2:
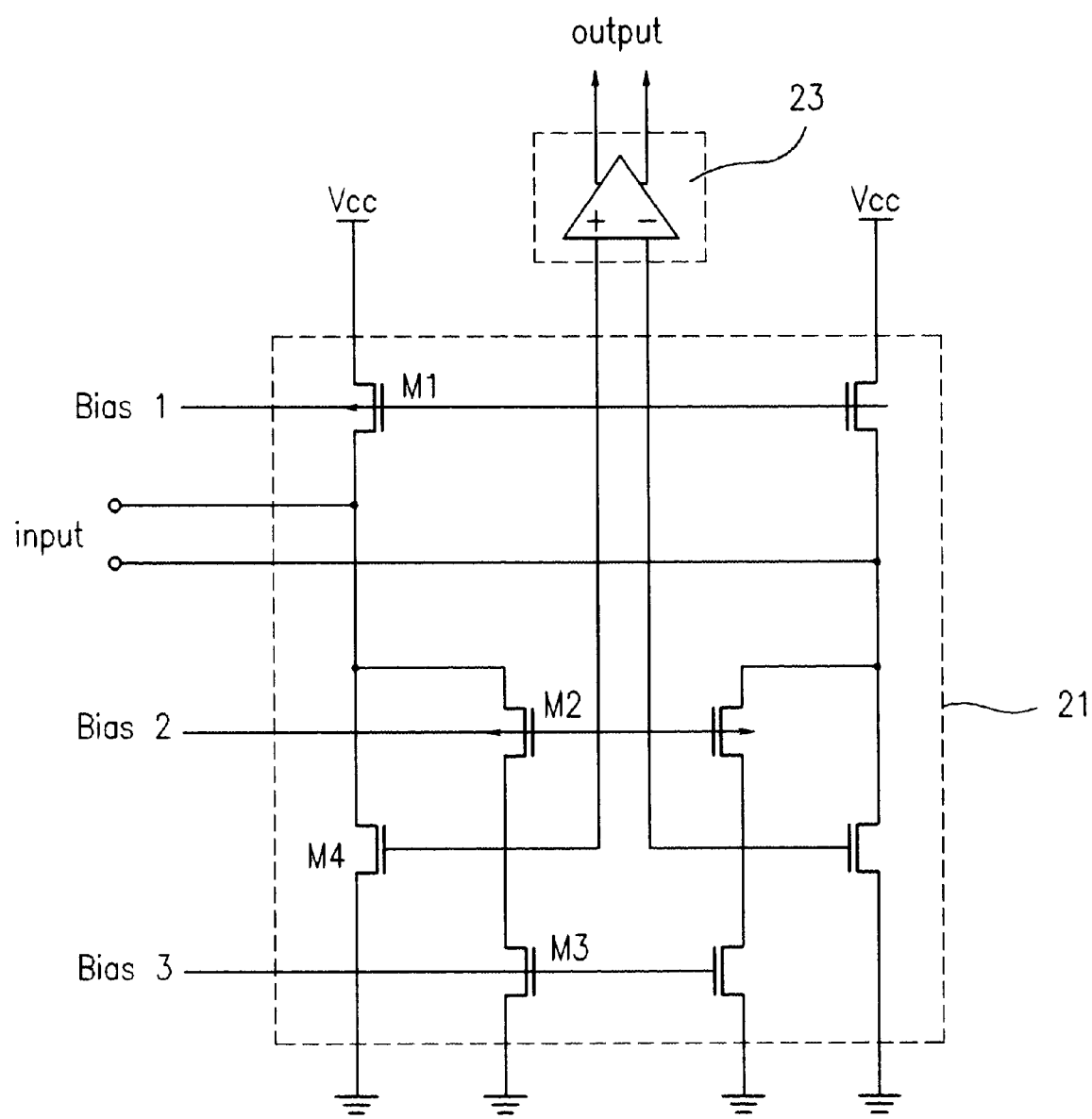
FIG. 2 is a circuit diagram showing a related art main amplifier using a current sensing method.
Figure 3:
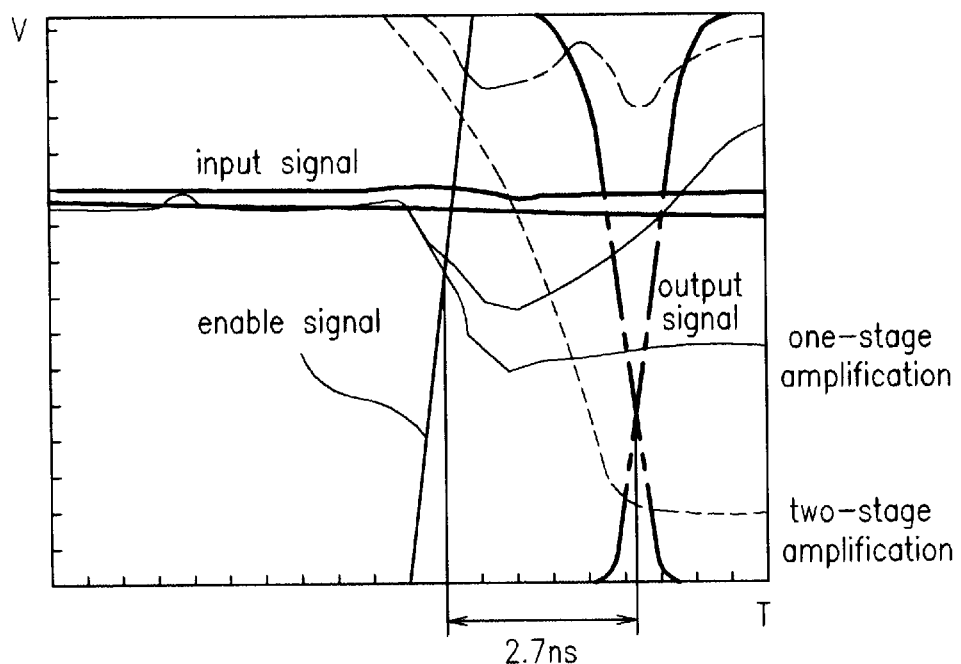
FIG. 3 is a diagram graphically showing simulated timing waveforms of the main amplifier of FIG. 1.
Figure 6:
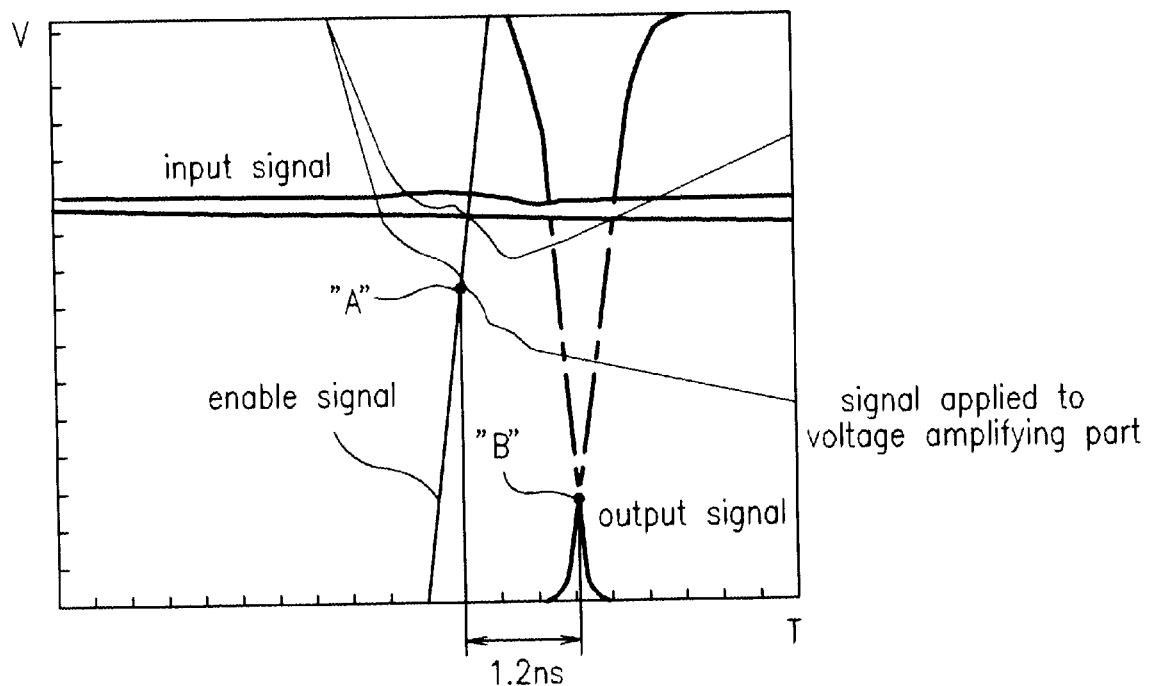
FIG. 6 is a diagram graphically showing timing waveforms of the amplifier of FIG. 4.

FIG. 6 graphically depicts simulation results of the preferred embodiment of the main current sense amplifier in accordance with the present invention. When comparing FIG. 6 to FIG. 3, the time to produce an output from the preferred embodiment of the main amplifier after it has started to operate is significantly reduced. That is, it takes about 1.2 ns relative to the about 2.7 ns (shown in FIG. 3) to produce an output signal from the related art main amplifier after it has started to operate. As shown in FIG. 6, "A" designates a point of driving the preferred embodiment of the main amplifier, and "B" indicates a point of producing an output signal from the main amplifier.

As described above, the preferred embodiment of a main amplifier has various advantages. The preferred embodiment of a main amplifier according to the present invention can prevent an input signal decrease caused by low power supply voltage through the current amplification. The preferred embodiment of also can prevent the signal transmission delay caused by parasitic capacitance by utilizing the current sensing method to assure high speed performance.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. An amplifier, comprising:
  a current converting circuit that amplifies signals applied from a first data bus and a second data bus and converts the amplified signal currents into a voltage; and
  a voltage amplifier circuit that amplifies the voltage from the current converting circuit to produce an amplified output, wherein the current converting circuit includes a plurality of current mirrors, and each of the respective signals from the first and second data bus is amplified by at least two of the plurality of current mirrors.

2. The amplifier of claim 1, wherein the current converting circuit comprises a converting part that includes a pair of transistors having control electrodes coupled together, first electrodes coupled together and coupled to a first prescribed voltage, and second electrodes receiving respective amplified signals outputted by the plurality of current mirrors.

3. The amplifier of claim 2, wherein a second prescribed voltage is applied to the control electrodes of the pair of transistors to operate the pair of transistors in a saturation region.

4. The amplifier of claim 3, wherein the control, first and second electrodes are respectively gate, source and drain electrodes, wherein the first and second prescribed voltages are respectively a power supply voltage and a bias voltage, and wherein the pair of transistors are PMOS transistors.

5. A main current sense amplifier, comprising:
  a first current amplifier circuit that amplifies a first data bus signal;
  a second current amplifier circuit that amplifies a second data bus signal;
  a converting circuit that converts the amplified first and second data bus signals into a voltage; and
  a voltage amplifying circuit that amplifies the voltage output from the converting circuit,
  wherein
    the converting circuit has a current/voltage converter, comprising:
      a first transistor having a first electrode coupled to a supply voltage, a second electrode coupled between the amplified first data bus signal and a first input terminal of the voltage amplifying circuit, and a control electrode coupled for receiving a bias voltage; and a second transistor having a first electrode coupled to the supply voltage, a second electrode coupled between the amplified second data bus signal and a second input terminal of the voltage amplifying circuit, and a control electrode coupled for receiving the bias voltage.

6. The main current sense amplifier of claim 5, wherein the second current amplifier circuit comprises:
   a first current mirror amplifying a first time the second data bus signal; and
   a second current mirror amplifying a second time the second data bus signal amplified by the first current mirror.

7. The main current sense amplifier of claim 5, wherein the converting circuit comprises a pair of transistors having control electrodes coupled together, first electrodes coupled together and coupled to a first prescribed voltage, and second electrodes respectively receiving the amplified first and second data bus signals.

8. The main current sense amplifier of claim 5, further comprising:
   a first enabling circuit that enables the first current amplifier circuit; and
   a second enabling circuit that enables the second current amplifier circuit.

9. The main current sense amplifier of claim 8, wherein said first and second enabling circuits are MOS transistors.

10. A method of operating a current sense amplifier, comprising:
    amplifying a first signal current applied through a first data bus;
    amplifying a second signal current applied through a second data bus;
    converting each of the amplified first and second signal currents into a voltage using a converting circuit having a current/voltage converter, wherein the current/voltage converter comprises,
        a first transistor having a first electrode coupled to a supply voltage, a second electrode coupled between the amplified first data bus signal and a first input terminal of a voltage amplifying circuit, and a control electrode coupled for receiving a bias voltage, and
        a second transistor having a first electrode coupled to the supply voltage, a second electrode coupled between the amplified second data bus signal and a second input terminal of the voltage amplifying circuit, and a control electrode coupled for receiving the bias voltage; and
    amplifying the voltage to generate an output signal with the voltage amplifying circuit, wherein the amplifying a first signal current includes,
        amplifying the first signal current applied through the first data bus;
        amplifying the amplified first signal current; and
        outputting the twice current amplified first signal current.

11. The method of claim 10, further comprising:
    enabling a first current amplifier to amplify the first signal current; and
    enabling a second current amplifier to amplify the second signal current.

12. The amplifier of claim 1, the current converting circuit having a current/voltage converter, comprising:
    a first transistor having a first electrode coupled to a supply voltage, a second electrode coupled between the amplified signal current from the first data bus and a first input terminal of the voltage amplifier circuit, and a control electrode coupled for receiving a bias voltage; and
    a second transistor having a first electrode coupled to the supply voltage, a second electrode coupled between the amplified signal current from the second data bus and a second input terminal of the voltage amplifier circuit, and a control electrode coupled for receiving the bias voltage.

13. The main current sense amplifier of claim 5,
    wherein the first current amplifier comprises:
        a first current mirror amplifying a first time the first data bus signal; and
        a second current mirror amplifying a second time the first data bus signal amplified by the first current mirror.

* * * * *